(12) United States Patent
Sun et al.

(10) Patent No.: US 8,104,342 B2
(45) Date of Patent: Jan. 31, 2012

(54) PROCESS CONDITION MEASURING DEVICE

(75) Inventors: Mei H. Sun, Los Altos, CA (US); Mark Wiltse, Redwood City, CA (US); Wayne G. Renken, San Jose, CA (US); Zachary Reid, Los Gatos, CA (US); Tony DiBiase, San Jose, CA (US)

(73) Assignee: KLA-Tencor Corporation, San Jose, CA (US)

( * ) Notice: Subject to any disclaimer, the term of this patent is extended or adjusted under 35 U.S.C. 154(b) by 774 days.

(21) Appl. No.: 12/034,041

(22) Filed: Feb. 20, 2008
(Under 37 CFR 1.47)

(65) Prior Publication Data

US 2009/0056441 A1    Mar. 5, 2009

Related U.S. Application Data

(60) Provisional application No. 60/891,360, filed on Feb. 23, 2007.

(51) Int. Cl.
*G01D 11/24* (2006.01)
(52) U.S. Cl. .......................................... 73/431
(58) Field of Classification Search ...................... 73/431
See application file for complete search history.

(56) References Cited

U.S. PATENT DOCUMENTS

| | | | |
|---|---|---|---|
| 4,137,451 A | 1/1979 | Einolf, Jr. ................. | 250/231.13 |
| 4,438,394 A | 3/1984 | Ekdahl ............................ | 324/126 |
| 4,458,202 A | 7/1984 | Nefedov et al. .............. | 324/204 |
| 5,444,637 A | 8/1995 | Smesny et al. ................ | 702/127 |
| 5,989,349 A | 11/1999 | Ke et al. ......................... | 118/728 |
| 6,140,833 A | 10/2000 | Flietner et al. ................ | 324/765 |
| 6,244,121 B1 | 6/2001 | Hunter ........................... | 73/865.9 |
| 6,417,552 B1 | 7/2002 | Van Arendonk .............. | 257/431 |
| 6,542,835 B2 | 4/2003 | Mundt ............................. | 702/65 |
| 6,553,277 B1 | 4/2003 | Yagisawa et al. ............. | 700/204 |
| 6,691,068 B1 | 2/2004 | Freed et al. ..................... | 702/187 |

(Continued)

FOREIGN PATENT DOCUMENTS

DE        10314150         12/2004

(Continued)

OTHER PUBLICATIONS

Office Action for U.S. Appl. No. 11/430,315 dated Mar. 27, 2008.

(Continued)

*Primary Examiner* — Hezron E Williams
*Assistant Examiner* — Alex Devito
(74) *Attorney, Agent, or Firm* — Joshua D. Isenberg; JDI Patent

(57) ABSTRACT

An instrument for measuring a parameter comprises a substrate, a plurality of sensors carried by and distributed across a surface of the substrate that individually measure the parameter at different positions, an electronic processing component carried by the substrate surface, electrical conductors extending across the surface connected to the sensors and the electronic processing component, and a cover disposed over the sensors, electronic processing component and conductors. The cover and substrate have similar material properties to a production substrate processed by a substrate processing cell. The instrument has approximately the same thickness and/or flatness as the production substrate. The instrument may be subjected a substrate process and one or more parameters may be measured with the instrument during the process. The behavior of a production wafer in the substrate process may be characterized based on measurements of the parameters made with the one or more sensors.

37 Claims, 4 Drawing Sheets

U.S. PATENT DOCUMENTS

| | | |
|---|---|---|
| 6,703,169 B2 | 3/2004 | Fuller et al. |
| 6,723,981 B2 | 4/2004 | Corrado et al. ............... 250/239 |
| 6,820,028 B2 | 11/2004 | Ye et al. ......................... 702/117 |
| 6,830,650 B2 | 12/2004 | Roche et al. ............. 156/345.24 |
| 6,882,143 B2 | 4/2005 | Clymer et al. ................. 324/174 |
| 6,902,646 B2 | 6/2005 | Mahoney et al. ........ 156/345.24 |
| 7,135,852 B2 | 11/2006 | Renken et al. ............. 324/158.1 |
| 7,151,366 B2 | 12/2006 | Renken et al. |
| 2004/0003828 A1* | 1/2004 | Jackson ............................ 134/1 |
| 2004/0007326 A1 | 1/2004 | Roche et al. ............. 156/345.24 |
| 2004/0154417 A1 | 8/2004 | Renken et al. ............... 73/866.1 |
| 2004/0225462 A1* | 11/2004 | Renken et al. .................. 702/94 |
| 2005/0011611 A1 | 1/2005 | Mahoney et al. ........ 156/345.24 |
| 2005/0034811 A1 | 2/2005 | Mahoney et al. ........ 156/345.24 |
| 2005/0034812 A1 | 2/2005 | Roche et al. ............. 156/345.24 |
| 2005/0151544 A1 | 7/2005 | Mahoney et al. ............. 324/655 |
| 2005/0217796 A1 | 10/2005 | Carter et al. ............. 156/345.24 |
| 2005/0246127 A1 | 11/2005 | Renken et al. ................. 702/117 |
| 2005/0248004 A1* | 11/2005 | Chang et al. .................. 257/632 |
| 2005/0284570 A1 | 12/2005 | Doran et al. ............. 156/345.24 |
| 2006/0008716 A1* | 1/2006 | Jeunink et al. .................. 430/30 |
| 2006/0043063 A1 | 3/2006 | Mahoney et al. ................ 216/61 |
| 2006/0249729 A1 | 11/2006 | Mundt et al. .................... 257/48 |
| 2006/0289763 A1 | 12/2006 | Mundt et al. ............... 250/338.3 |
| 2007/0029632 A1 | 2/2007 | Hausner et al. ............... 257/434 |
| 2007/0055403 A1 | 3/2007 | MacDonald et al. ......... 700/108 |

FOREIGN PATENT DOCUMENTS

| | | |
|---|---|---|
| EP | 1014437 | 6/2000 |
| WO | WO2004099063 | 11/2004 |

OTHER PUBLICATIONS

U.S. Appl. No. 60/430,858, entitled "Integrated Process Condition Sensing Wafer and Data Analysis System", to Renken et al., filed Dec. 3, 2002.

U.S. Appl. No. 60/722,554, entitled "Methods and Apparatus for Measuring Electrical Parameters of a Plasma Process", to Mundt et al., filed Sep. 30, 2005.

U.S. Appl. No. 60/677,545, entitled "Apparatuses for and Methods of Monitoring Optical Radiation Parameters for Substrate Processing", to Mundt et al., filed May 3, 2005.

U.S. Appl. No. 60/285,439, entitled "Methods, Apparatus, and Computer Program Products for Obtaining Data for Process Operation, Optimization, Monitoring and Control", to Freed et al., filed Apr. 19, 2001.

International Search Report and Written Opinion of the International Searching Authority dated Jul. 15, 2008—International application No. PCT/US2008/054369.

* cited by examiner

PROCESS CONDITION MEASURING DEVICE

CLAIM OF PRIORITY

This application claims the benefit of priority of commonly-assigned U.S. Provisional Patent Application No. 60/891,360, filed Feb. 23, 2007, the entire contents of which are incorporated herein by reference.

FIELD OF THE INVENTION

Embodiments of the present invention relate to semiconductor wafer processing, LCD display glass substrate processing, magnetic memory disc processing, and other devices fabricated from thin film processes, and, more specifically, to a system that can sense and record processing conditions and transmit data to a receiver.

BACKGROUND OF THE INVENTION

The fabrication of an integrated circuit, display or disc memory generally employs numerous processing steps. Each process step must be carefully monitored in order to provide an operational device. Throughout the imaging process, deposition and growth process, etching and masking process, etc., it is critical, for example, that temperature, gas flow, vacuum, pressure, chemical, gas or plasma composition and exposure distance be carefully controlled during each step. Careful attention to the various processing conditions involved in each step is a requirement of optimal semiconductor or thin film processes. Any deviation from optimal processing conditions may cause the ensuing integrated circuit or device to perform at a substandard level or, worse yet, fail completely.

Within a processing chamber, processing conditions vary. The variations in processing conditions such as temperature, gas flow rate and/or gas composition greatly affect the formation and, thus, the performance of the integrated circuit. Using a substrate to measure the processing conditions that is of the same or similar material as the integrated circuit or other device provides the most accurate measure of the conditions because the material properties of the substrate is the same as the actual circuits that will be processed. Gradients and variations exist throughout the chamber for virtually all process conditions. These gradients, therefore, also exist across the surface of a substrate, as well as below and above it. In order to precisely control processing conditions at the wafer, it is critical that measurements be taken upon the wafer and the readings be available in real time to an automated control system or operator so that the optimization of the chamber processing conditions can be readily achieved. Processing conditions include any parameter used to control semiconductor or other device fabrication or any condition a manufacturer would desire to monitor.

The PEB and PAB hotplate stations have been measured for several years with instrumented wafer apparatuses, but not with the capability to apply photoresist in any convenient or practical manner. These wafers were only required to measure temperature from the bottom of the wafer where the hotplate was, so were not designed with thinness in mind, nor were they sealed for wet environments. The standard practice is to place the instrumentation on the top surface of the wafer.

For resist dispense step, discrete probes have been used to measure the temperature of the material as it passes through the nozzle or applicator. No wafer based metrology has existed. Resist dispense stations normally rotate at up to 5000 rpm, and the resist material could damage electronics, so the apparatus needs to be mechanically balanced, sealed, and thermally balanced. This has not existed until the Integral Wafer invention.

To the best of the inventors' knowledge, there has never been an apparatus that measured the wafer temperature during exposure before. The exposure systems require strict flatness and thickness specifications, so a thin planar architecture is required.

Furthermore, post processing of the wafer may induce overlay distortion effects. To the best of the inventors' knowledge there has never been a wafer-based apparatus that can measure such effects in situ.

Some prior art methods use wafers that are not sealed and mechanically balanced for spinning. Consequently these methods are unable to make measurements at the resist application/dispense station. In addition, such methods use wafers that are not planar so exposure systems. Furthermore, previous sensor wafers are not thin enough for use at an exposure station. In addition, some prior art sensor wafers are not sealed and planar enough to enable photoresist compatibility and easy removal of the photoresist. Prior art sensor wafers typically have discrete probes and are, therefore, not sufficiently spatially resolved for many applications. In addition, such wafers do not directly measure the wafer response.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Figure 1A:
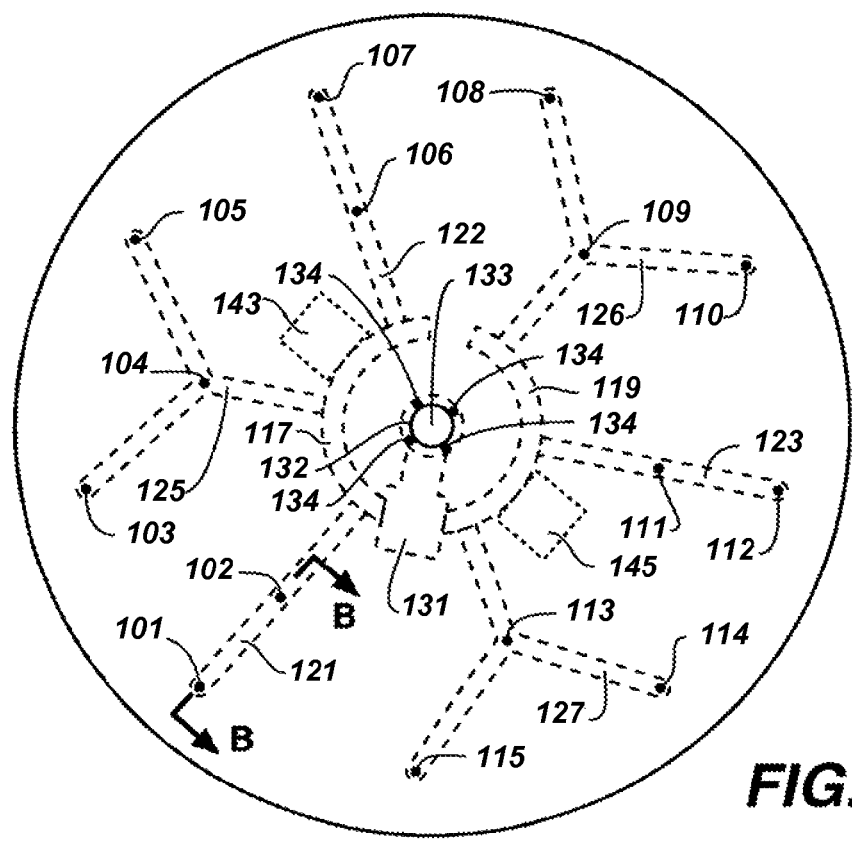
FIG. 1A is a plan view of an embodiment of a process condition measuring device (PCMD) and FIG. 1B a cross-section thereof taken at section B-B of FIG. 1A.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention provide for accurate measurement of the thermal response of a wafer to the process conditions for the lithographic pattern transfer process in semiconductor manufacturing.

Embodiments of the present invention provide for a process condition measuring device (PCMD) having approximately the same thickness and/or flatness as a standard production substrate. It is also often desirable that the PCMD have a top surface that is made of the same type of material as the production substrates. By way of non-limiting example production substrates may be semiconductor wafers, e.g., silicon wafers or reticles. Reticles are often made using a quartz substrate. As used herein, the term approximately the same thickness means that the PCMD thickness is within an acceptable thickness tolerance range for the production wafers. The thickness tolerance range for production wafers is largely dependent on the requirements of particular tools that process them. Some tools can tolerate a thickness variation of more than 50% from some specified average thickness. Other tools require a much smaller tolerance, e.g., a 20 to 25 micron variation for 12-inch (300-mm) diameter wafers that are nominally about 775 microns thick. Similarly, the term approximately the same flatness as a production wafer means that a surface of the PCMD has a flatness that is within the tolerance range for the production substrates. Again, these tolerance ranges may vary depending on the application of the substrates and the tools being used on them. However, for a substrate that undergoes a particular sequence of processes involving multiple tools, the acceptable variation in thickness or flatness is largely dependent on the tool or process having the tightest tolerance requirement.

According to an embodiment of the present invention process condition measuring device (PCMD) is disclosed that may be delivered to a target environment, acquire a wide range of data and return to a handling system with little disruption to the target environment or the tool containing the target environment. The PCMD is designed to have similar characteristics to the substrates normally handled by the tool. The characteristics of such substrates are generally specified by industry standards. Thus, for a system designed for 300 mm silicon wafers, the PCMD has a silicon substrate and has similar physical dimensions to those of a 300 mm wafer. Components may be located within cavities in the substrate to keep the profile of the PCMD the same as, or close to that of a 300 mm wafer. Because of its dimensions and its wireless design, the PCMD may be handled by a robot as if it were a 300 mm wafer. It may undergo the process steps undergone by wafers such as etch, clean, photolithography etc. The PCMD may be configured to record process conditions such as temperature, pressure, gas flow rate radiofrequency (RF) voltage and current during processing and uploads the data when requested. Conditions during transport and storage may also be monitored and recorded.

By way of example, the PCMD may generally include a substrate having a plurality of sensors carried by and distributed at positions across a surface of the substrate that individually make measurements the parameter at those positions. One or more electronic processing components may be carried by the substrate surface. Electrical conductors extend across the substrate surface and are connected to the sensors and electronic processing component(s). The sensors and electronic component may be positioned in cavities formed into the substrate surface. A material may fill the cavities around the sensors and electronic component(s). An example of such a PCMD, a method for its manufacture and a handling system for use with the PCMD are described in detail in U.S. Pat. No. 7,135,852 to Wayne Glenn Renkin et al., the disclosures of which are incorporated herein by reference.

By way of example, the sensors, associated power supplies and interconnects may be implemented using a very thin flex circuit. For discrete PCMD components, one could form cavities for the flex circuit and the components and place the flex circuit and the components in the cavities. Typically the component cavities are deeper than the flex cavities. Alternatively, the interconnect lines can be made of lithographically formed thin film metal lines directly onto the surface of the wafer. In this case, for each component, there will be a two-level recessed cavity. The deeper cavity formed for component to be situated in, e.g., near center of cavity, is surrounded by shallower cavity of larger perimeter. The thin film interconnect lines are extended into the shallower part of the cavity to form bond pads. It is desirable that the component and its interconnects be recessed below surface of substrate. Wirebond interconnects or thin flex circuit interconnect (e.g. in the form of a ring) can be used to connect between pad or bump on component and pad formed from metal in shallow part of cavity. By way of example, the depth of the shallow cavity can be recessed 3 mils from the wafer surface and the metal pad width greater than 5 mils In some cases it may be desirable to passivate the metal with an oxide or nitride before depositing a cover over the components and interconnects.

By recessing the components and interconnects the cover is disposed over a PCMD that is as flat as possible to begin with.

Alternatively, if PCMD components such as sensors, power supplies and the like are formed using photolithography, electrical interconnects to these components may be formed directly on the wafer surface or a passivation layer formed on the wafer surface using photolithographic techniques.

Various sensors and other components may be formed in recesses in a bottom substrate so that a top surface of the PCMD is totally flush. The flex circuit may then be covered with a thin cover over it so that the PCMD is basically the same thickness as a production substrate. For example, if a 12-inch diameter, 775 micron thick Silicon wafer is used as a bottom substrate and a 12-in Silicon wafer 50 microns thick is used as a cover. The back surface of the bottom substrate may be lapped by the same thickness as the cover (e.g., 50 microns). The top surface of the cover may also be lapped and polished to achieve the required tolerance. In some embodiments, the PCMD may be subjected to thermal cycling to stabilize thickness variation before a final lap and polish. The front surface of the cover may be polished to approximately the same degree of flatness as a production substrate. In addition, the cover may be made of a material that is compatible with a process environment for the production substrate.

Where the sensors and other circuit components of the PCMD are formed in recesses, e.g., trenches, space between the circuit components and the trenches may be perfectly filled with a filling material, which may then be lapped so that the cover is perfectly flat.

According to an embodiment of the invention a wafer PCMD having features in common with the one described above may be made thin enough to enter the exposure station of a lithography or other substrate processing cell. Substrate processing may include, but is not limited to lithography process steps (resist deposition, pre-bake, exposure, post bake, etching, material deposition and the like), chemical mechanical polishing (CMP), substrate cleaning processes, metrology processes (e.g., scattterometry, critical dimension scanning electron microscopy (CD-SEM) and the like), material deposition, wet or dry etching, etc. After such processing, deposited material may be removed from the surface of the PCMD so that the PCMD may be reused. To create a very low profile, the PCMD may use very thin covers of or silicon or a polymer such as polyimide. The low profile is important for both fit and function within exposure systems, affecting system access and bubble shape.

By way of example the PCMD may be made using a production grade silicon wafer as a substrate with advanced circuitry built inside the substrate. The circuitry may be sealed with a configurable cover. For exposure lithography applications, a very thin, flat, cover with excellent thermal conductivity may be used. A variety of cover types and thicknesses, may be used, e.g., a polymer such as polyimide and thin silicon or silicon coated with a polymer such as polyimide. It is noted that it is desirable that the contact angle on the cover to be same or similar as for production wafer. Specifically, it is to be able to wet the surface of the PCMD substrate with the resist or other film in the same manner it wets the surface of a production substrate. The covers may be bonded to the substrate, sandwiching the electronics and sensors in between, and shielding the circuits from water, liquid photoresist, other environmental contaminants or electromagnetic fields. The wafer may be fabricated in clean environments, and carefully wetcleaned in SC1, SC2 and scrubbed prior to shipment to customers.

The PCMD may be made planar enough to undergo exposure in the exposure station. In addition, the wafer may be mechanically balanced and spinable to rotation rates up to about 5000 rpm. The PCMD may be sealed so it can be used in wet, or PR-on environments. In addition the PCMD may have configurable skins or covers, to optimize the PCMD for the environment in which it will be used. The device may be mechanically balanced by distributing the weight with respect to an axis of rotation of the device. This is largely a matter properly distribution the layout of the components.

Referring to FIG. 1A, a PCMD based on a circular wafer is shown in plan view. Only fifteen sensors 101-115 (e.g., temperature sensors) are shown for simplicity of explanation, many more usually being desired for a typical test wafer. By way of example, the sensors 101-115 may be pressure, mechanical strain, sheer strain, humidity, air flow, electrical probes, e.g., Langmuir probes for plasma processes, optical sensor, position or orientation (tilt, roll, yaw) sensors. Strips of polymer film containing electrical conductors extend between sensors attached to them and one of two half-circle polymer film segments 117 and 119 that contain an interconnecting bus therein. Film strips 121-123 may extend in straight radial lines and each have two sensors attached, and film strips 125-127 may be "Y" shaped with three sensors attached to each. Alternatively, all the segments may be formed in a single flex circuit. This would avoid having to join separate segments together, e.g., with solder. Another polymer film segment 131 positioned between the two bus segments 117 and 119 includes the micro-controller and associated electronic components attached to it. The sensors and film strips and segments may be contained within the substrate, most conveniently mounted between top and bottom plates having the same outer dimensions. The film segment 131 may extend to another polymer segment 132 that connects with an external center coil 133 and one or more transceivers 134 on the top exposed surface. By way of example and without limitation, the transceivers 134 may be used for data communication to or from the PCMD. The transceivers 134 may communicate using radiofrequency (RF) techniques, optical, e.g., infrared techniques. Batteries 143 and 145 may be electrically connected to the bus in respective half-circle portions 117 and 119. There may alternatively be only one battery or more than two batteries installed, depending upon the application and resulting power needs. The sensors, electronic components and power source are thus connected together into a system described elsewhere herein (such as by FIG. 18 of U.S. Pat. No. 7,135,852, which has been incorporated herein by reference) by the conductors in the polymer film segments within the substrate structure. The polymer utilized is preferably polyimide.

The batteries 143 and 145 may be mounted on the top surface of the substrate but are preferably also contained within the substrate. A closable opening (not shown) may then optionally be provided in one of the plates over each of the batteries for access to replace them during the life of the instrument. It is preferred that both sides of the completed substrate be smooth without any components mounted on these surfaces.

Figure 1B:
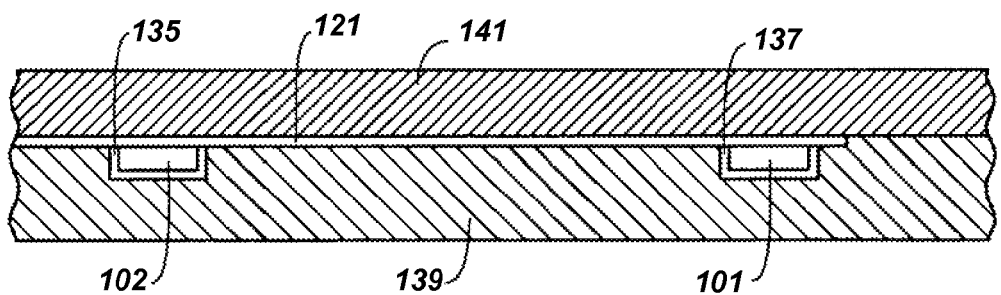
FIGS. 1C-1D are cross-sectional views of a portion of a process condition measuring device (PCMD) according to an embodiment of the present invention.

Referring to the cross-sectional view taken along the polymer strip 121, shown in FIG. 1B, cavities 135 and 137 are formed in a bottom disc 139 to contain the respective sensors 101 and 102. These sensors may be pre-attached to the polymer strip 121 and directly electrically and mechanically connected to the conductors therein without the use of bond wires. Indeed, the straight polymer strips 121-123 may be the same, as may each of the "Y" strips 125-127, which greatly simplifies manufacturing. Only a limited number of different polymer segment structures need to be made. In this embodiment, only two different sensor assemblies are used plus the electronic component assembly in film segment 131 and the segment 132 for the coil 133 and LEDs 134. In each of these, the components may be attached to the polymer segments before installation as a pre-assembled unit into grooves provided in the top surface of the bottom substrate 139 for the polymer to extend between the cavities containing the sensors and other components. The sensors and other components on the individual polymer segments can even be tested and calibrated before installation.

Once all the polymer segments are installed in the bottom substrate 139, a cover 141 may be then attached to the bottom disc. The cover 141 may have the same outside shape as the bottom substrate 139. The cover 141 and bottom substrate 139 have similar material properties to those of a production substrate that is to be processed by a substrate processing cell. By way of example, the cover 141 may be made of silicon approximately 50 microns thick. Such silicon covers may be obtained commercially, e.g., from Disco Corporation of Tokyo, Japan. The cover may be bonded to the bottom substrate 139, e.g., using an adhesive, such as a low-viscosity silicone adhesive. Examples of such adhesives are commercially available, e.g., from General Electric of Schenectady, N.Y. A cover made of silicon is often desirable, e.g., for testing of immersion lithography systems. The substrate 139 and cover 141 may be made of the same or different materials. In some embodiments, the substrate 139 or cover 141 may include a layer of photoresist or oxide or other material on an exposed upper surface thereof.

The combination of bottom substrate 139 with sensors 101-115 and associated electronic components, film segments and cover 141 form a completed PCMD. In alternative embodiments, the grooves for the film strips and segments may be formed on the bottom surface of the cover 141. A more complicated layout having many more sensors is implemented in the same manner, although there may be one or a few additional different polymer segment shapes with sensors and/or other components attached.

The sensors and other components are preferably attached to the bottom of the disc cavities, as illustrated in FIG. 1B where the temperature sensing chips 101 and 102 are attached to the bottoms of respective cavities 135 and 137. It may be desirable for the sensors 101-115 to be at the same temperature as the wafer onto which they are mounted. In such cases, any space around the sensors and components within their cavities may be filled with thermally conductive material. It is noted that in many cases it may also be desirable to thermally insulate certain PCMD components, such as batteries and microprocessors, since they might not tolerate elevated temperatures. The adhesive and fill materials can be the same as described with respect to FIG. 1C of U.S. Pat. No. 7,135,852. Since the polymer strips and other segments cover only a small portion of the area of the resulting measuring device, bottom disc 139 and cover 141 may be firmly mechanically, thermally and electrically attached with an appropriate adhesive over nearly all of the area of the two discs, preferably more than eighty percent or even ninety percent of their common area. In this example, the bottom substrate 139 and cover 141 are circular with the same diameter. However, this particular configuration is not to be construed as a limitation on the invention.

As a result of these features, the sensors, electronic components, conductors, polymer and other elements within the disc perturb the temperatures measured across the wafer very little. Because of the protection provided the electrical elements by the structure of FIGS. 1A and 1B, the device may be used to measure temperatures a variety of hostile environments such as in plasma, wet and plating processes, as well as for tuning a photoresist process hot plate. Of course, the instrument is not limited to these specific applications. Nor is the configuration illustrated in FIGS. 1A and 1B limited to the measurement of temperature, as sensors of other parameters that can be measured from within the structure may be substituted for the temperature sensors. And in most any application, the instrument can be inverted when used, the bottom substrate 139 and cover 141 being reversed.

Figure 1C:
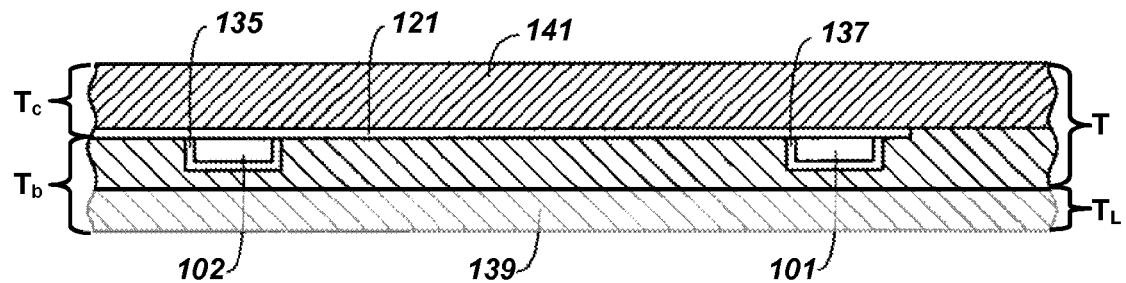

To make the PCMD of FIG. 1A-1B sufficiently thin that it has approximately the same thickness as a production wafer the backside of the wafer may be lapped by an amount sufficient to compensate for the added thickness due to the cover 141. For example, as shown in FIG. 1C, the PCMD may be based on a bottom disc having a thickness $T_b$. The cover adds a thickness $T_c$ to the PCMD so that the overall thickness is $T+T_c$ that is greater than a thickness T for a production substrate. To compensate for the additional thickness, the bottom disc 139 may be lapped by an amount $T_L$ so that the overall thickness of the PCMD is equal to T. By way of example, the bottom substrate 139 may have an initial thickness $T_b=T$, in which case $T_L=T_c$.

Figure 1D:
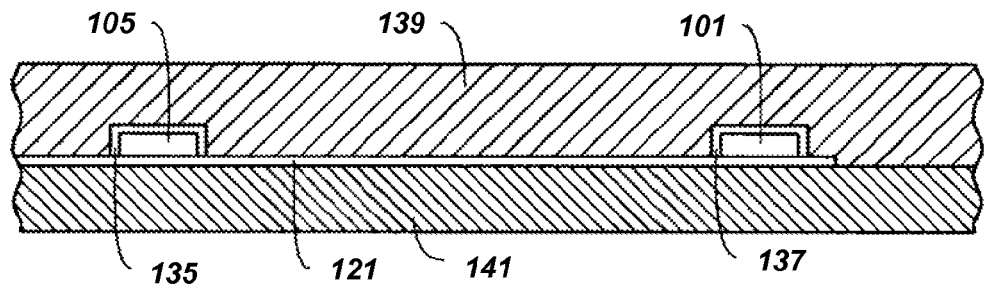

In addition to having approximately the same thickness as a production substrate it is also often desirable for the PCMD to have approximately the same degree of global and local flatness as a production wafer. As used herein, global flatness refers to warpage of the PCMD substrate and local flatness refers to a surface profile or topography of the substrate relative to some average substrate surface. There are a number of different techniques for achieving this. In some cases, where a flex circuit is built on to of the bottom substrate 139, it may not be possible to achieve the desired flatness by lapping the cover. Such flex circuits are often made of polyimide, which may tend to conform to voids between the circuit elements and the recesses in which they reside. A filler material may optionally be disposed in the trenches containing the circuit elements to fill such voids. To achieve a desired flatness, the bottom substrate 139 of the PCMD may be lapped and the whole apparatus turned upside down during use, as shown in FIG. 1D so that processing (e.g., resist deposition and baking) may take place on the exposed surface of the bottom substrate 139. The exposed surface of the bottom substrate 139 may be lapped so that it has the same flatness as the exposed surface of production substrates. The cover 141 may also be lapped, but may only need to be as flat as required for a backside surface of the production substrates. Make cover flat enough to be the bottom (e.g., flat enough for chucking).

Figure 2A:
FIGS. 2A-2E are a sequence of cross-sectional schematic diagrams illustrating fabrication of a PDMD according to an embodiment of the present invention.
Figure 2B:
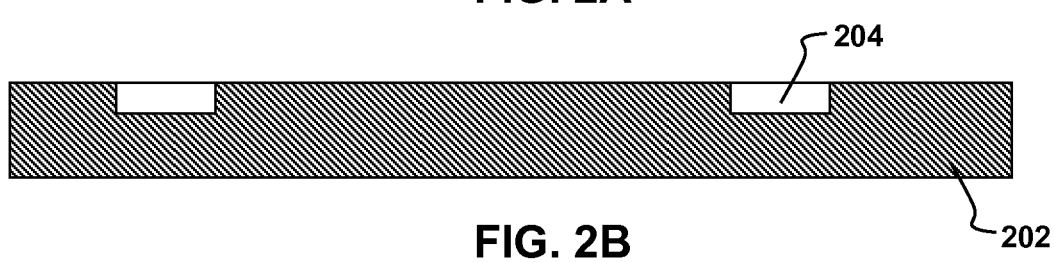
Figure 2C:
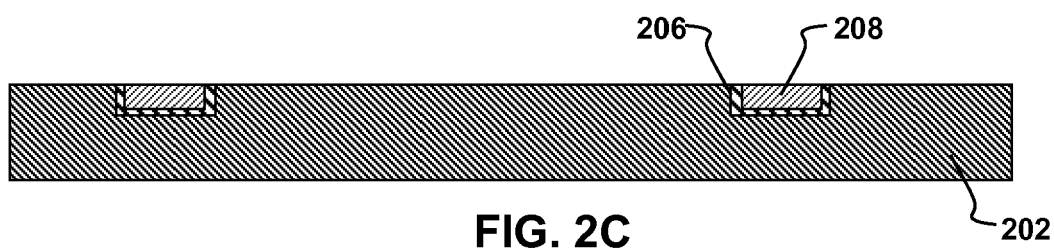

In another alternative embodiment a PCMD may have thin film sensors built directly on a wafer using thin film technology. This avoids having to form trenches and fill trenches with a filler material. An example of fabrication of such a PCMD is shown in FIGS. 2A-2E. Fabrication starts from a suitable substrate 202 as shown in FIG. 2A. By way of example, the substrate 202 may be made of silicon. Sensors, power supplies interconnects may then be formed on or in the substrate 202. For example, as shown in FIG. 2B one or more recesses 204 may be etched into the substrate 202, e.g., using conventional photolithography and etch techniques. The recesses 204 may be lined with insulating material 206 as shown in FIG. 2C. Device material 208 (e.g., semiconductor or conductor material) may then be disposed, e.g., deposited or otherwise formed, on the remaining spaces in the recesses 204.

Figure 2D:
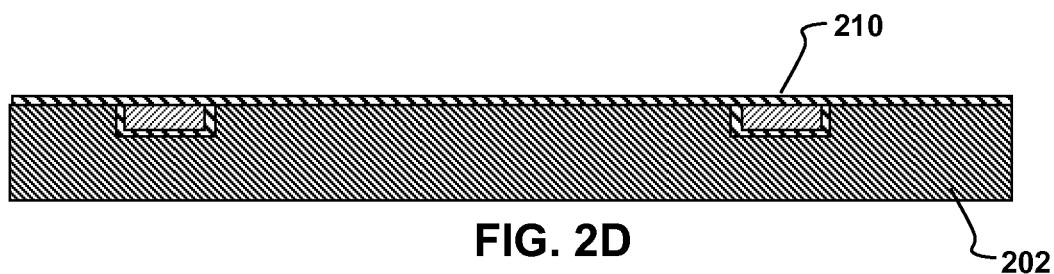
Figure 2E:
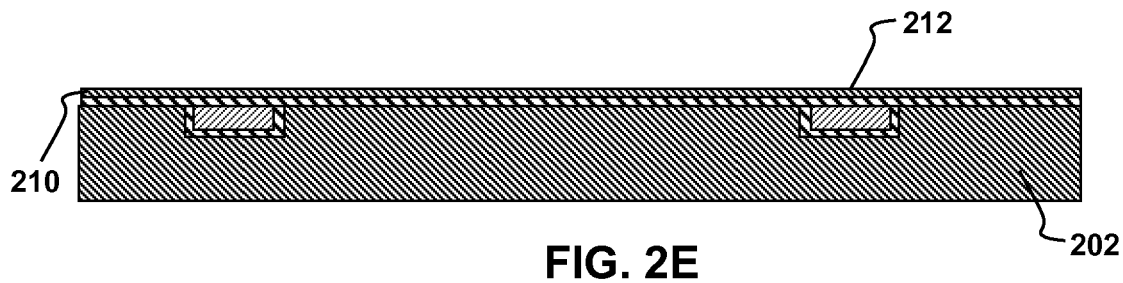

The device material 208 may be covered with a cover 210 as shown in FIG. 2D. By way of example, the cover 210 may be an insulating material, e.g., an oxide, such as silicon dioxide ($SiO_2$). The cover 210 may be attached to the substrate 202 using an adhesive, e.g., as described above. Alternatively, the cover 210 may be formed by depositing a layer of insulator material on the device material 208. Preferably, the deposition takes place at sufficiently low temperature that the circuit components made of the device material 208 are not damaged in the processes. To provide a surface that is made of the same material as production substrates an additional top layer 212 may be formed on or attached to the cover 210 as shown in FIG. 2E. By way of example, a layer of single crystal or polycrystalline silicon may be deposited of the cover 210. Alternatively, e.g., for a PCMD to be used to test processing of reticles, the top layer 212 may be made of quartz or other reticle material. As noted above, the PCMD may be subjected to thermal cycling to stabilize thickness variation before a final lap and polish.

In an alternative embodiment a PCMD may be fabricated as depicted in schematically in FIGS. 3A-3F. Fabrication may start with a thin substrate 302, e.g., a silicon wafer, of initial thickness $T_{si}$. By way of example and without loss of generality, $T_{si}$ may be about 500 microns (20 mils). Components such as sensors, power supplies, processors and interconnects, e.g., flex circuits, may be formed on the substrate 302 in a manner similar to that shown in FIGS. 3B-3D. Specifically, Take cover that's already thinned, e.g., to 380 microns and bond the cover to the top surface of the substrate covering the components and interconnects. Then lap the cover down by 125 microns (5 mils) so that the thickness of the finished device is 775 microns. In this case it's very important that if any discrete components are used, the combined thickness of the interconnect circuit and components is less than 250 microns to provide sufficient strength.

Figure 3A:
FIGS. 3A-3F are a sequence of cross-sectional schematic diagrams illustrating fabrication of a PDMD according to an alternative embodiment of the present invention.
Figure 3B:
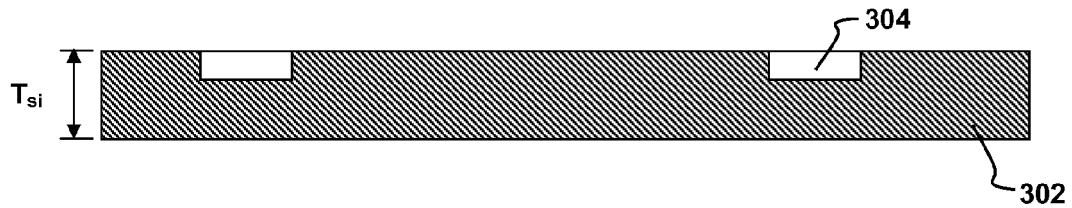
Figure 3C:
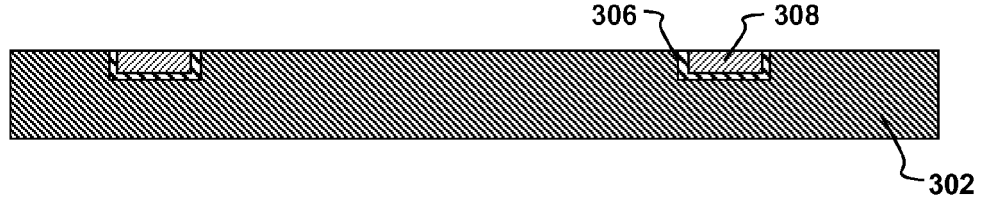

One or more recesses 304 may be ground, photolithographically etched, or otherwise formed into the substrate 302, as shown in FIG. 3B. The recesses 304 may be lined with electrically insulating and/or thermally conductive material 306 as shown in FIG. 3C. Device material 308 (e.g., semiconductor or conductor material) may then be disposed, e.g., deposited, or attached, or otherwise formed, on the remaining spaces in the recesses 304.

Figure 3D:
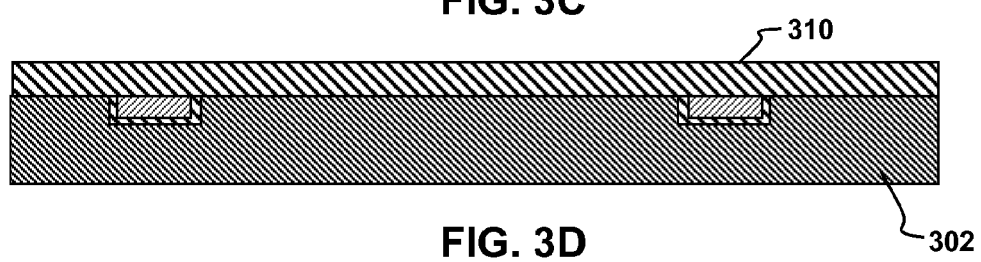
Figure 3E:
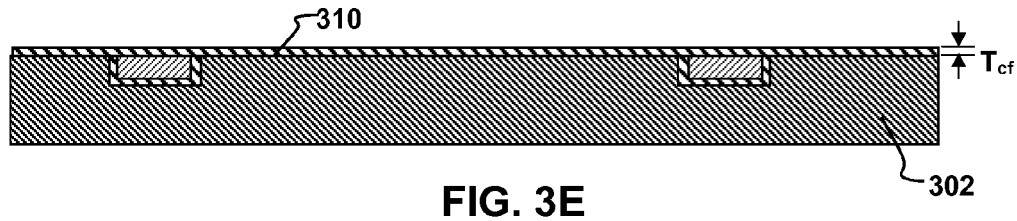
Figure 3F:
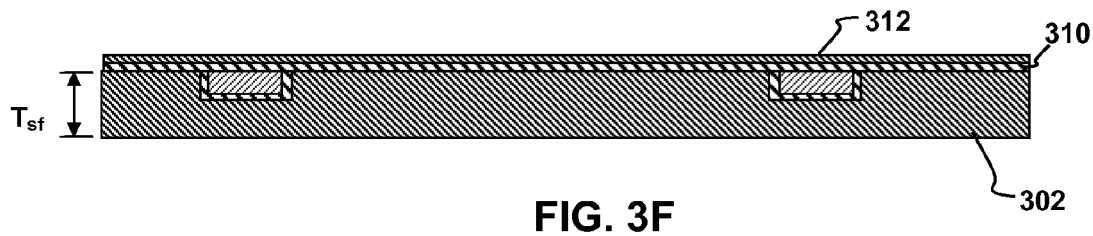

The device material 308 may be covered with a cover 310 as shown in FIG. 3D. The cover 310 may be an insulating material, e.g., an oxide, such as silicon dioxide ($SiO_2$) attached to the substrate 302 by an adhesive, e.g., as described above. The cover 310 may alternatively be formed by depositing a layer of insulator material on the device material 308, e.g., as described above. The cover may have an initial cover thickness $T_{ci}$. To reduce the overall thickness of the PCMD to a desired thickness, the bottom surface of the substrate 302 may be lapped to reduce its thicknesses to a final substrate thickness $T_{sf}$ as shown in FIG. 3E. The top surface of the cover 310 may be similarly lapped to reduce its thickness to a final cover thickness $T_{cf}$. The top surface of the cover and the bottom surface of the substrate may be polished to a desired degree of smoothness. In addition, a top layer 312 that is made of the same material as production substrates may be added, as shown in FIG. 3F. The top layer 312 may also be lapped and polished to reduce the overall thickness of the PCMD.

As noted above, the PCMD may be subjected to thermal cycling to stabilize thickness variation before a final lap and polish.

According to one alternative embodiment, the PCMD may be processed to create structures on it, including structures that are customized by the user According to another alternative embodiment the PCMD may have sufficient resolution and accuracy to detect exposure lithography thermal effects. Specifically, for exposure lithography applications, precisely located sensors (e.g., 65 sensors for 300 mm wafers or 53 sensors for 200 mm wafers) may be very tightly calibrated across a narrow temperature range (18-28° C.). This yields accuracy and resolution suitable for use with wireless wafer technology. The use of wireless wafer technology in this context allows delineation of subtle thermal responses of wafers and photoresists during exposure processes. Given the importance of temperature on the lithography process, exposure system designers often take great care and expense to equalize the temperature of the wafer on the exposure stage by using conditioning stations prior to delivering the wafer to the stage. With an Integral Wafer of the type described herein, lithographers can now characterize this important process and monitor the tool for proper performance.

In addition it is desirable that the flatness and thickness remain within a predetermined tolerance (e.g., thickness and flatness tolerance of no more than 5 to 10 micron variation in thickness and flatness out of 775 micron total thickness), roughly 1-2% variation in thickness and flatness.

Also want to maintain a high degree of flatness and thickness tolerance after elevated temperature (>120° C.) thermal cycling. Can do this by match thermal expansion coefficients of cover and substrate and/or use a very thin adhesive layer, less than 10 microns for 775 micron total thickness, so about 1-2% of total thickness depending on mismatch of thermal expansion coefficient of adhesive material to expansion coefficients of substrate and cover. You also want to avoid outgassing by the adhesive during thermal cycling and other processing.

According to another embodiment the PCMD may detect the thermal response to a resist application process while spinning and while actual photoresist is being applied to the surface of the PCMD.

Various aspects of the above embodiments may be combined so that a PCMD may be used to measure the entire integrated process of a lithography cell, or any selected subsequence desired Embodiments of the present invention, facilitate several different levels of application. For example, PCMD of the type described above provide the ability to measure the thermal response of a wafer as it is processed throughout a lithography cell is believed to be unique. The lithography cell may include a plurality of process steps including, but not limited to Bottom Anti-Reflection Coating (BARC) or equivalent, Resist Dispense, Post Apply Bake (PAB), Pattern Transfer Exposure, Post Exposure Bake (PEB), and Develop/Rinse. The ability to measure the composite, complete run is believed to be unique, as well as the ability to measure several of the stations in the lithography cell.

PCMD of the type described above also provide the ability to measure the thermal response of the lithography cell described above with a resist coated wafer so the actual process or near actual process can be measured, not just a 'dry' run.

Embodiments of the present invention provide the ability to pattern the resist coated apparatus wafer allows a creative explosion of potential applications. For example, using a PCMD of the type described above temporal thermal data may be correlated with end state measurements such as optical Critical Dimension results so the process can be tuned with more precision, power and speed.

Furthermore PCMD of the type described above allow the ability to change individual or sets of process conditions within the integrated process and to measure the impact on thermal response, as well as final result. This may be extremely valuable in process tuning. In addition process changes may be correlated with thermal response data and defect results using a PCMD of the type described above.

Embodiments of the present invention allow for dissection of thermal effects from other effects for a variety of process recipes as well as film integration schemes (BARC, DARC, PR thickness, Resist Apply Temp, PEB Temp, etc).

The ability to characterize the thermal behavior of the wafer during exposure would allow modelers to accurately predict overlay errors. These models could then be used to shave nm of CD error due to displacement variation. It is possible to create a correction algorithm which servos the exposure process to the real data results taken from wafer apparatus.

The ability to measure fine temperature differences on the various stages and conditioning plates within the exposure system allow the tool to be equalized and have consistent thermal performance wafer to wafer, lot to lot, etc. The thermal component of the CD error budget has been modeled and empirically determined to be on the order of 1 nm per mK, depending on the model, resist, etc.

PCMD of the type described above also allow the ability to construct special versions of the apparatus that can be used as calibration instruments, such as overlay.

PCMD of the type described above also allow the ability to measure various stages within and exposure system for thermal optimization and the ability to use the temperature measurements to correlate and correct overlay distortion error.

Test results and examples illustrating the usefulness of embodiments of the present invention are described in Appendix A and Appendix B which are included explicitly as part of the present specification and which are incorporated herein by reference.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. An instrument for measuring a parameter, comprising: a substrate, a plurality of sensors carried by and distributed at positions across a surface of the substrate that individually measure the parameter at those positions, at least one electronic processing component carried by the substrate surface, electrical conductors connected to the plurality of sensors and said at least one electronic processing component; and a cover that is separate and distinct from the substrate disposed over the sensors, electronic processing component and conductors, wherein the instrument has approximately the same thickness and/or flatness as a production substrate, wherein the sensors, electronic processing component and conductors are disposed between the cover and the substrate, wherein the cover and substrate have similar material properties to those of the production substrate that is to be processed by a substrate processing cell.

2. The instrument of claim 1, wherein the substrate has been lapped by an amount corresponding to a thickness of the cover.

3. The instrument of claim 1 wherein a back surface of the substrate has been polished to approximately the same degree of flatness as the production substrate.

4. The instrument of claim 1 wherein a front surface of the cover has been polished to approximately the same degree of flatness as the production substrate.

5. The instrument of claim 1 wherein the cover comprises silicon, quartz, an oxide, polymer, or a photoresist material.

6. The instrument of claim 1 wherein the cover is made of a material that is compatible with a process environment for the production substrate.

7. The instrument of claim 1 wherein a surface of the substrate or cover is made sufficiently planar enough to undergo exposure in an exposure station of a lithography cell.

8. The instrument of claim 1 wherein the instrument is mechanically balanced and spinable to rotation rates up to about 5000 rpm.

9. The instrument of claim 1 wherein the instrument is sealed so it can be used in wet, or PR-on environments.

10. The instrument of claim 1 wherein the sensors are sufficient in number and spacing to provide resolution and accuracy to detect exposure lithography thermal effects.

11. The instrument of claim 1 wherein the instrument is configured to detect a thermal response to a resist application process while spinning and while actual photoresist is being applied to a surface of the substrate or cover.

12. The instrument of claim 1 wherein the one or more sensors comprise one or more pressure, mechanical strain, sheer strain, humidity, air flow, electrical probes, Langmuir probes for plasma processes, optical sensors, position or orientation (tilt, roll, yaw) sensors.

13. The instrument of claim 1, wherein the substrate or cover has been lapped by a sufficient amount to reduce a thickness of the instrument to a desired thickness.

14. A method for measuring parameters of a substrate process, comprising, subjecting a process condition monitoring device (PCMD) to the substrate process and measuring one or more parameters with the PCMD during the substrate process, wherein the PCMD comprises a substrate, a plurality of sensors carried by and distributed at positions across a surface of the substrate that individually measure the one or more parameters at those positions, at least one electronic processing component carried by the substrate surface, electrical conductors extending across the substrate surface and connected to the plurality of sensors and said at least one electronic processing component; and a cover disposed over the sensors, electronic processing component and conductors, wherein the instrument has approximately the same thickness and/or flatness as the production substrate, wherein the sensors, electronic processing component and conductors are disposed between the cover and the substrate, wherein the cover is separate and distinct from the substrate, wherein the cover and substrate have similar material properties to those of a production substrate that is to be processed by a substrate process; and characterizing the behavior of a production wafer in the substrate process based on measurements of the parameters made with the one or more sensors.

15. The method of claim 14 wherein subjecting the PCMD to the substrate process includes creating one or more structures on a surface of the PCMD.

16. The method of claim 14 wherein the PCMD may have sufficient resolution and accuracy to detect exposure lithography thermal effects.

17. The method of claim 16 wherein the substrate process is a lithography process.

18. The method of claim 16 wherein the sensors include one or more precisely located sensors.

19. The method of claim 18 wherein the one or more sensors comprise one or more pressure, mechanical strain, sheer strain, humidity, air flow, electrical probes, Langmuir probes for plasma processes, optical sensors, position or orientation (tilt, roll, yaw) sensors.

20. The method of claim 17 wherein subjecting the PCMD to the substrate process includes subject the PCMD to an entire integrated process of a lithography cell, or selected sub-sequence thereof.

21. The method of claim 20 wherein characterizing the behavior of the production wafer includes measuring a thermal response of the PCMD as it is processed throughout the lithography cell.

22. The method of claim 20, wherein the lithography cell comprises Bottom Anti-Reflection Coating (BARC) or equivalent, Resist Dispense, Post Apply Bake (PAB), Pattern Transfer Exposure, Post Exposure Bake (PEB), and Develop/Rinse processes.

23. The method of claim 14 wherein the one or more sensors are very tightly calibrated across a narrow temperature range.

24. The method of claim 14 wherein measuring the one or more parameters with the PCMD includes detecting a thermal response to a resist application process with the PCMD while spinning the PCMD and while applying photoresist to a surface of the PCMD.

25. The method of claim 14 wherein measuring the one or more parameters with the PCMD includes coating the PCMD with a resist and measuring a thermal response of the lithography cell with PCMD coated with the resist.

26. The method of claim 14 wherein characterizing the behavior of the production wafer in the substrate process includes obtaining temporal thermal data with the one or more sensors and correlating the temporal thermal data with end state measurements.

27. The method of claim 14, further comprising, changing one or more process conditions within the substrate process and measuring an impact of the change in process conditions on thermal response of the PCMD.

28. The method of claim 27, further comprising correlate the changes in process conditions with thermal response data and defect results using the PCMD.

29. The method of claim 14 wherein measuring the one or more parameters includes measuring one or more temperature differences on various stages and conditioning plates within an exposure system for thermal optimization.

30. The method of claim 14 wherein characterizing the behavior of a production wafer in the substrate process includes correlating and correcting an overlay distortion error.

31. The method of claim 14 wherein subject the PCMD to the substrate process comprises forming one or more layers of material on a surface of the PCMD.

32. The method of claim 31, further comprising subjecting the PCMD to the processing, removing the one or more layers of material from the surface of the PCMD so that the PCMD may be reused.

33. The method of claim 14, wherein the substrate or cover has been lapped by a sufficient amount to reduce a thickness of the PCMD to a desired thickness.

34. A method for fabricating a process condition measuring device (PCMD), comprising:
   distributing a plurality of sensors at positions across a surface of a substrate such that the substrate carries the sensors, wherein each of the sensors individually measures one or more parameters at their respective positions,
   disposing at least one electronic processing component on the substrate surface, such that the electronic component is carried by the substrate,
   disposing one or more electrical conductors extending across the substrate surface such that the conductors are connected to the plurality of sensors and said at least one electronic processing component; and
   disposing a cover over the sensors, electronic processing component and conductors, wherein the instrument has approximately the same thickness and/or flatness as the production substrate, wherein the sensors, electronic processing component and conductors are disposed between the cover and the substrate, wherein the cover is separate and distinct from the substrate, wherein the cover and substrate have similar material properties to those of a production substrate that is to be processed by a substrate process.

35. The method of claim 34, further comprising lapping the cover and/or substrate to reduce a thickness of the PCMD to a desired thickness.

36. The method of claim 34, further comprising polishing a top surface of the cover to approximately the same degree of flatness as a production substrate.

37. The method of claim 34, further comprising disposing a top layer on a top surface of the cover, wherein the top layer is made of the same material as the production substrate.

* * * * *